US006992351B2

(12) United States Patent
Matsuki et al.

(10) Patent No.: US 6,992,351 B2
(45) Date of Patent: Jan. 31, 2006

(54) SEMICONDUCTOR DEVICE FOR POWER MOS TRANSISTOR MODULE

(75) Inventors: Hirobumi Matsuki, Yokohama (JP); Tsuyoshi Oota, Yokohama (JP); Yuji Hiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 24 days.

(21) Appl. No.: 10/876,611

(22) Filed: Jun. 28, 2004

(65) Prior Publication Data

US 2005/0224887 A1   Oct. 13, 2005

(30) Foreign Application Priority Data

Apr. 9, 2004   (JP) ............... 2004-115737

(51) Int. Cl.
  H01L 29/76   (2006.01)
  H01L 29/94   (2006.01)
  H01L 31/62   (2006.01)
  H01L 31/113  (2006.01)
  H01L 31/119  (2006.01)

(52) U.S. Cl. ............ 257/331; 257/328; 257/329; 257/331; 257/501; 257/506

(58) Field of Classification Search ........ 257/327–335, 257/501, 506, 510
See application file for complete search history.

(56) References Cited

U.S. PATENT DOCUMENTS

| | | | |
|---|---|---|---|
| 6,424,028 B1 * | 7/2002 | Dickinson | ............... 257/678 |
| 6,653,740 B2 | 11/2003 | Kinzer et al. | |
| 6,673,680 B2 * | 1/2004 | Calafut | ............... 438/270 |
| 6,821,824 B2 * | 11/2004 | Minato et al. | ............... 438/138 |
| 6,838,722 B2 * | 1/2005 | Bhalla et al. | ............... 257/301 |

* cited by examiner

*Primary Examiner*—Jerome Jackson
*Assistant Examiner*—Jesse A. Fenty
(74) *Attorney, Agent, or Firm*—Oblon, Spivak, McClelland, Maier & Neustadt, P.C.

(57) ABSTRACT

A first transistor has a first main electrode region which is formed so that these are subdivided into a plurality of first isolated island region. A second transistor has its first main electrode region which are divided into a plurality of second isolated island regions in close proximity to the array of first island regions.

20 Claims, 12 Drawing Sheets

SEMICONDUCTOR DEVICE FOR POWER MOS TRANSISTOR MODULE

CROSS-REFERENCE TO PRIOR APPLICATION

This application is based upon and claims the benefit of priority from the prior Japanese Patent Application No. 2004-115737, filed on Apr. 9, 2004, the entire content of which is incorporated herein by reference.

BACKGROUND OF THE INVENTION

1. Field of the Invention

This invention relates generally to semiconductor devices, and more particularly to a semiconductor device applicable to power metal oxide semiconductor (MOS) transistor modules for use in protective circuitry of rechargeable batteries.

2. Description of Related Art

Rechargeable or secondary batteries such as lithium-ion batteries or the like are typically equipped with a protection circuit for protecting such secondary batteries against risks of overcharge/over-discharge and/or over-currents or else. A configuration of this protection circuit is schematically shown in FIG. 10. The illustrative protector circuit 100 is generally made up of a serial connection of two transistors QA and QB as connected to a secondary battery unit 200, and a control integrated circuit (IC) 300. The control IC 300 monitors a both-end voltage of the secondary battery 200 and electrical currents flowing in transistors QA and QB. Upon detection of either overcharge/overdischarge or flow of an overcurrent, IC 300 outputs a control signal (gate signal) for causing transistor QA or QB to switch from its conductive state to nonconductive state, thereby forcing secondary battery 200 to be electrically shut off from the load or from the power supply.

As demands grow for miniaturization or down-sizing of handheld wireless telephone handsets (mobile phones) or the like, such down-size demands are becoming more significant also for secondary battery protection circuitry. In the light of this trend, an attempt is made to shrink a protector circuit by arranging two MOS transistors (QA, QB) in a protector circuit as a power MOS transistor module that is packed or modularized in a single envelop or housing.

Another requirement for the transistors QA and QB making up such the protector circuit 100 is that these are low in turn-on (ON) resistivity to thereby enable mobile phones or the like with the secondary battery 200 connected thereto to run longer on a single charge-up. In the power MOS transistor module with the built-in transistors QA-QB also, it is required to have low ON resistance as an entirety of the module.

One known power MOS transistor module—i.e., first conventional art—is shown in FIGS. 11 to 13. FIG. 11 is a plan view of a power MOS transistor module in accordance with the first conventional art, and FIGS. 12–13 are cross-sectional diagrams of it as taken along lines A–A' and B–B' of FIG. 11, respectively.

As shown in FIG. 11, this power MOS transistor module in accordance with the first conventional art is arranged so that two transistors QA and QB each having a source region (first main electrode region) and a drain region (second main electrode region) are formed on a single piece of metal substrate (drain frame), wherein the drain regions of respective transistors QA and QB are common-coupled together by this metal substrate 50. Transistor QA includes a gate electrode 56A and source electrode 57A; transistor QB has a gate electrode 56B and source electrode 57B. The gate electrodes 56A and 56B are applied control signals (gate signals) from the above-stated controller IC 300 via gate electrode wiring lines 53. Source electrodes 57A and 57B are connected by source electrode wiring lines 54 to external elements or components (such as secondary battery 200, load or the like).

The transistors QA and QB are the so-called trench gate type MOS transistors such as shown in FIGS. 12–13. A trench-gate MOS transistor is the one that is arranged so that the sidewall of a trench gate is used as a channel region, causing a drain current to vertically flow from the source region toward the drain region being formed on the substrate's back surface. This trench-gate transistor is fabricated in a way which follows. Firstly a lightly-doped N ($N^-$) type epitaxial layer 11 is formed on a semiconductor substrate 10 that was formed as a heavily-doped N ($N^+$) type layer. Then, a P-type base layer 12 is selectively formed at a top surface portion of this $N^-$-type epitaxial layer 11. Next, a gate trench 13 is formed from the surface of this P-type base layer 12 to a depth reaching the $N^-$-type epitaxial layer 11.

Then, a gate dielectric film 14 is formed on the inner wall of this gate trench 13. Further, within this gate trench 13, a gate electrode 15 is formed by bury/embed techniques, which is made of impurity-doped polycrystalline silicon or "polysilicon." Thereafter, an interlayer dielectric film 16 made of silicon oxide is formed at the upper part of this gate electrode 15.

Additionally, in surface portions of P-type base layer 12 each of which is interposed between gate trenches 13, $N^+$-type source diffusion layers 17 are selectively formed so that one layer 17 is in contact with the side face of gate trench 13. Further at a portion between such $N^+$-type source diffusion layers 17, a $P^+$-type diffusion layer 18 is selectively formed. In this device structure, when a gate voltage being applied to gate trench 13 is controlled, a channel is formed along this $N^+$-type source diffusion layer 17.

This $N^+$-type source diffusion layer 17 receives a voltage applied from the secondary battery 200 via the source electrode 57A or 57B that is formed at the upper part thereof. Trench gate 13 is given a gate signal from the controller IC 300 via gate electrode 56A or 56B in the way stated previously. Gate electrodes 56A and 56B are connected to trench gates 13 via gate polysilicon wiring lines 58 and extension leads BL (see FIG. 12 or FIG. 13 or else). Gate polysilicon wires 58 are formed above $N^-$-type epitaxial layer 11 with a silicon oxide film 59 sandwiched therebetween. Note that gate electrode 56A (56B) and source electrode 57A (57B) are electrically isolated from each other by an interlayer dielectric film 60 and passivation film 61.

This power MOS transistor module shown in FIGS. 11–13 suffers from a limit in module shrinkage due to the presence of the thickness of metal substrate 50.

A power MOS transistor (second conventional art) with module shrinking capability is disclosed, for example, in U.S. Pat. No. 6,653,740. As shown in FIGS. 14–16, this transistor is structured so that the use of metal substrate 50 is eliminated, permitting two transistors QA and QB to share a single semiconductor substrate 10 for use as a drain region. An explanation will be given while adding in FIGS. 14–16 the same reference characters to the same parts or components as those of the first conventional art. FIG. 14 is a plan view of a power MOS transistor module in accordance with this second conventional art. FIGS. 15–16 are sectional diagrams of it as taken along lines C–C' and D–D' of FIG. 14, respectively.

The transistors QA and QB ate similar in structure to those of the first conventional art as shown in FIG. 15; however, as shown in FIG. 16, the transistors QA and QB commonly have or "share" n+-type semiconductor substrate 10 and n−-type epitaxial layer 11. In this structure of the second conventional art, a drain current flowing between transistors QA and QB is expected to flow in this semiconductor substrate 10. Thus the metal substrate 50 such as used in the first conventional art becomes unnecessary. This makes it possible to cause the power MOS transistor module to become less in size than that of the first conventional art. Optionally in this second conventional art, an N+-type layer 62 may be provided at the boundary between transistors QA and QB overlying the N−-type epitaxial layer 11.

The second conventional art circuitry is capable of meeting the need for miniaturization of power MOS transistor module as far as its ability to omit the metal substrate 50 is concerned. Unfortunately, the current flowing between two transistors QA–QB must pass through the semiconductor substrate 10, resulting in its electrical resistivity being greater than that of metal substrate 50 (FIGS. 11–13). Due to this, the ON resistance of an entirety of the power MOS transistor module becomes undesirably higher than that of the first conventional art, which leads to the lack of an ability to fully meet the requirements for reduction of power consumption.

SUMMARY OF THE INVENTION

A semiconductor device in accordance with one aspect of this invention includes a pair of first and second transistors which are formed together on the same semiconductor substrate. These transistors are arranged to flow a current between a first main electrode region and a second main electrode region through a channel being formed in a channel region. Either the first main electrode region or the second main electrode region is arranged to be owned in common or "shared" by the pair of first and second transistors. The first transistor is formed so that it is subdivided into a plurality of first isolated island regions, which are arranged on the semiconductor substrate. The second transistor is formed to be divided into a plurality of second isolated island regions, which are laid out adjacent to at least part of the first isolated island regions. At a portion whereat neighboring ones of the first isolated island regions face each other, such neighboring first islands are combined together into a unified first isolated island region. In this unified first isolated island region, part of the first transistor is integrally formed. At a portion whereat neighboring ones of the second islands face each other, such neighboring second islands are combined together into a unified second isolated island region. In this unified second isolated island region, part of the second transistor is integrally formed.

In accordance with another aspect of the invention, a semiconductor device includes a semiconductor substrate, and a first transistor and a second transistor formed above the semiconductor substrate. Each of the first and second transistors has a first main electrode region formed on one surface side of the substrate, a second main electrode region formed on the other surface side of the substrate, and a gate electrode formed on the one surface side of the substrate for controlling a current flowable between the first main electrode region and the second main electrode region, while letting the second main electrode region be owned in common by the first and second transistors. The first main electrode region of the first transistor is formed to be divided into a plurality of first isolated island regions on the one surface side of the semiconductor substrate. The first isolated island regions are commonly connected together to a first electrode wiring line through a plurality of first electrode layers formed at respective upper surfaces of the first isolated island regions. The first main electrode region of the second transistor is formed on the one surface side of the semiconductor substrate and is divided into a plurality of second isolated island regions in close proximity to the plurality of first isolated island regions. The plurality of second isolated island regions are commonly connected together to a second electrode wiring line via a plurality of second electrode layers formed at respective upper surfaces of the second isolated island regions. The gate electrode of the first transistor has a first connection region as connected to a first external gate wiring line. The gate electrode of the second transistor has a second connection region being laid out in a first direction together with the first connection region and being connected to a second external gate wiring line. The plurality of first isolated island regions and the plurality of second isolated island regions are arrayed in a second direction crossing over the first direction. The plurality of first isolated island regions include a specified first isolated island region which neighbors upon the first connection region and which has a first portion aligned in the first direction together with the first connection region. The plurality of second isolated island regions include a specified second isolated island region neighboring upon the second connection region and having a second portion aligned in the first direction together with the second connection region.

DETAILED DESCRIPTION OF THE INVENTION

Figure 1:
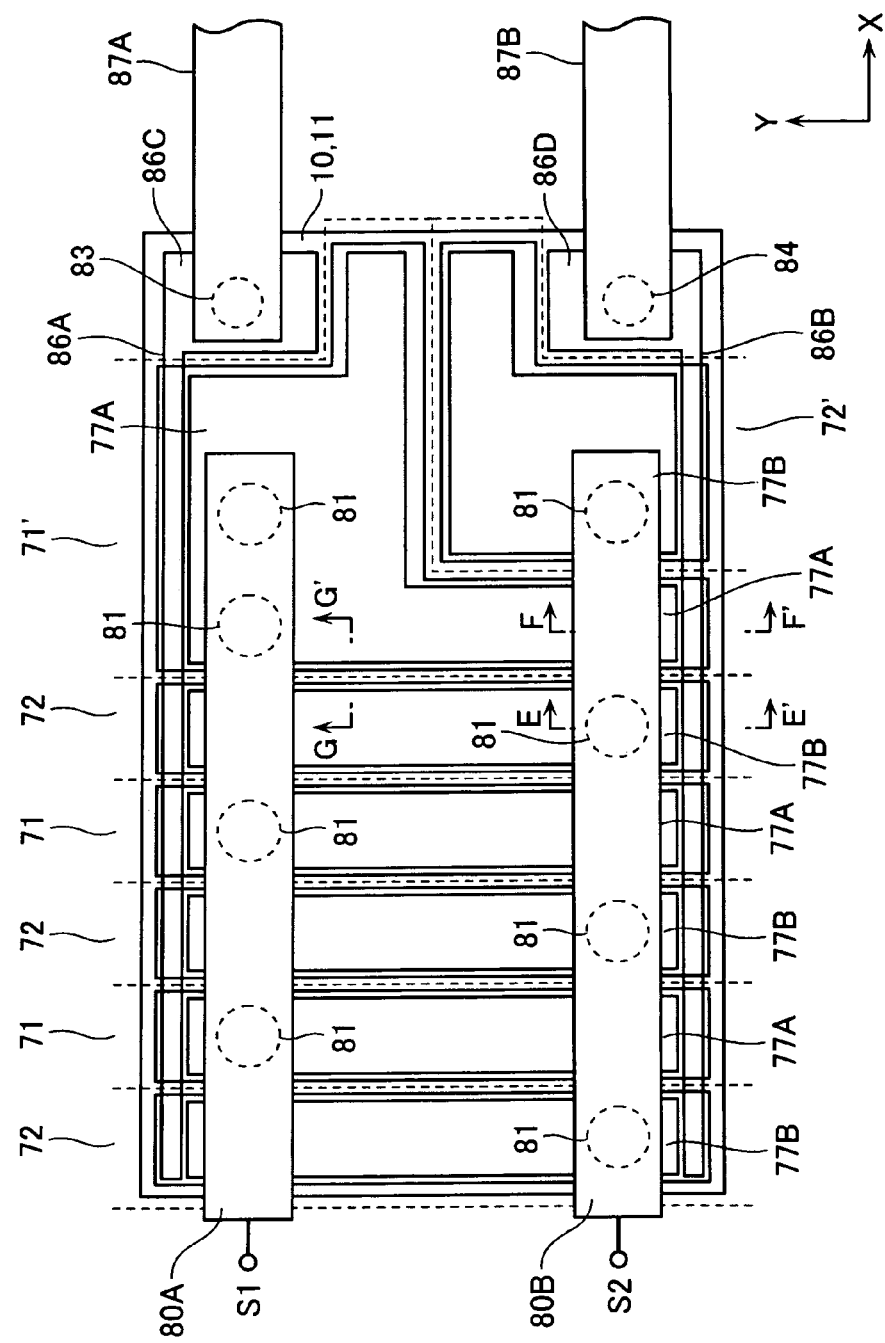
FIG. 1 shows a plan view of a power MOS transistor module in accordance with an embodiment of the present invention.
Figure 2:
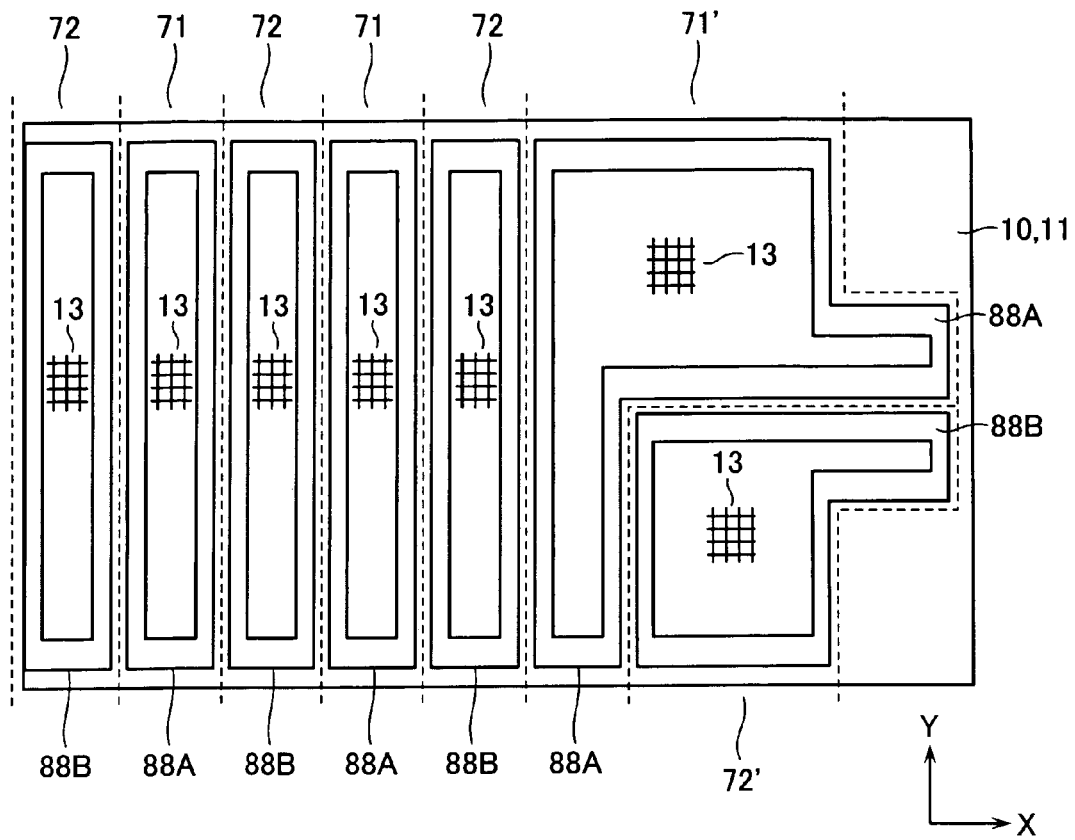
FIG. 2 shows a plan view of a gate polysilicon wiring line pattern (88A, 88B) of the power MOS transistor module in accordance with the embodiment of this invention.
Figure 3:
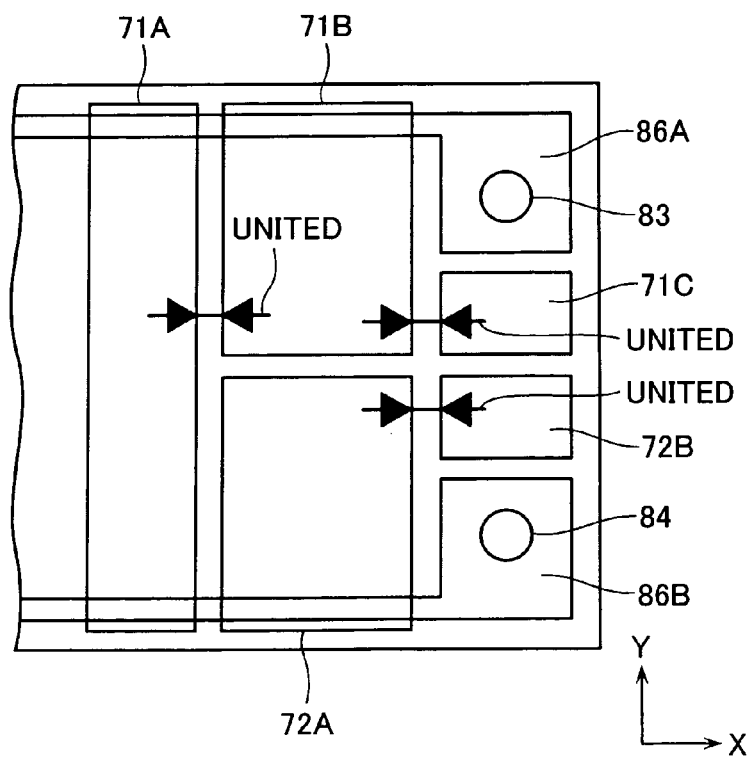
FIG. 3 is a diagram for explanation of a region for fabrication of two transistors QA and QB.
Figure 4:
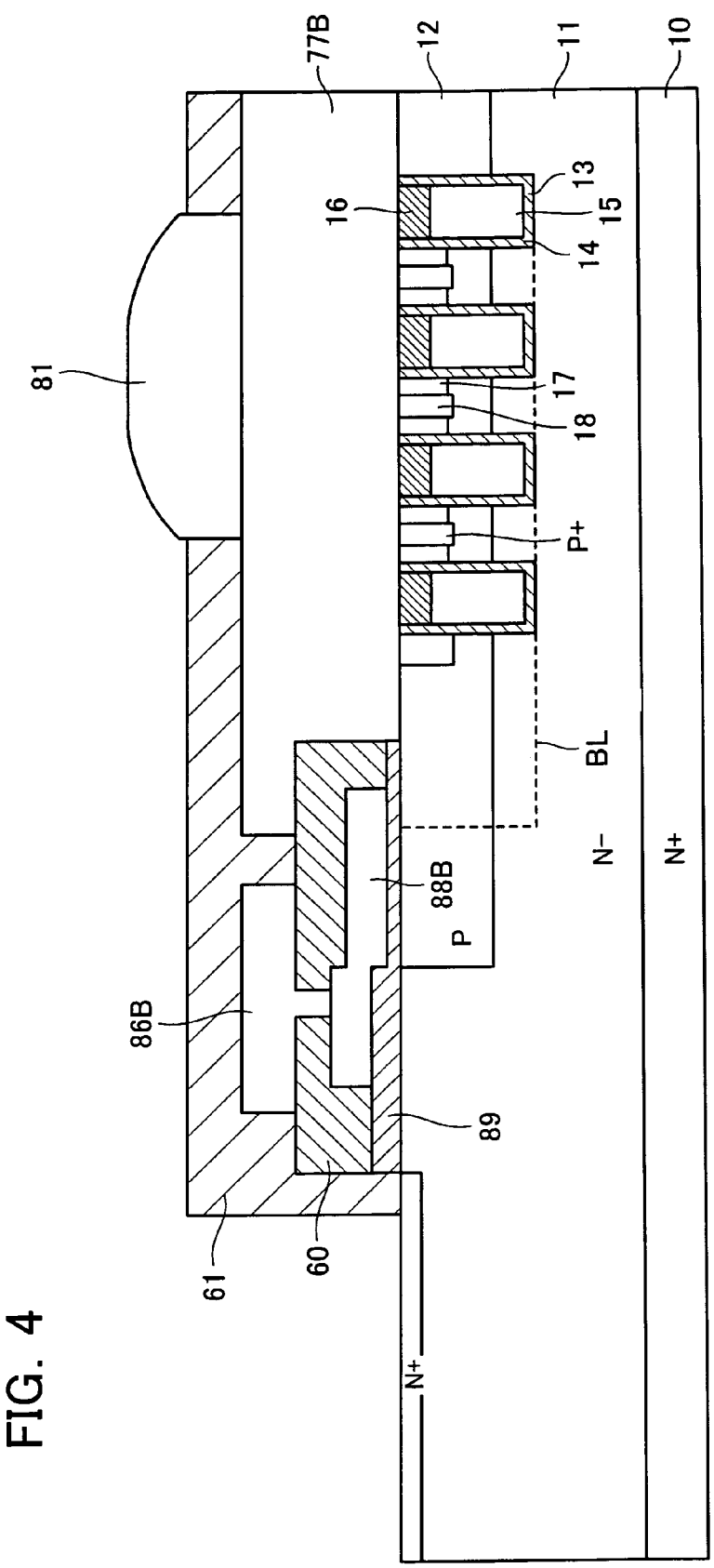
FIG. 4 shows a cross-sectional view as taken along line E–E' of FIG. 1.
Figure 5:
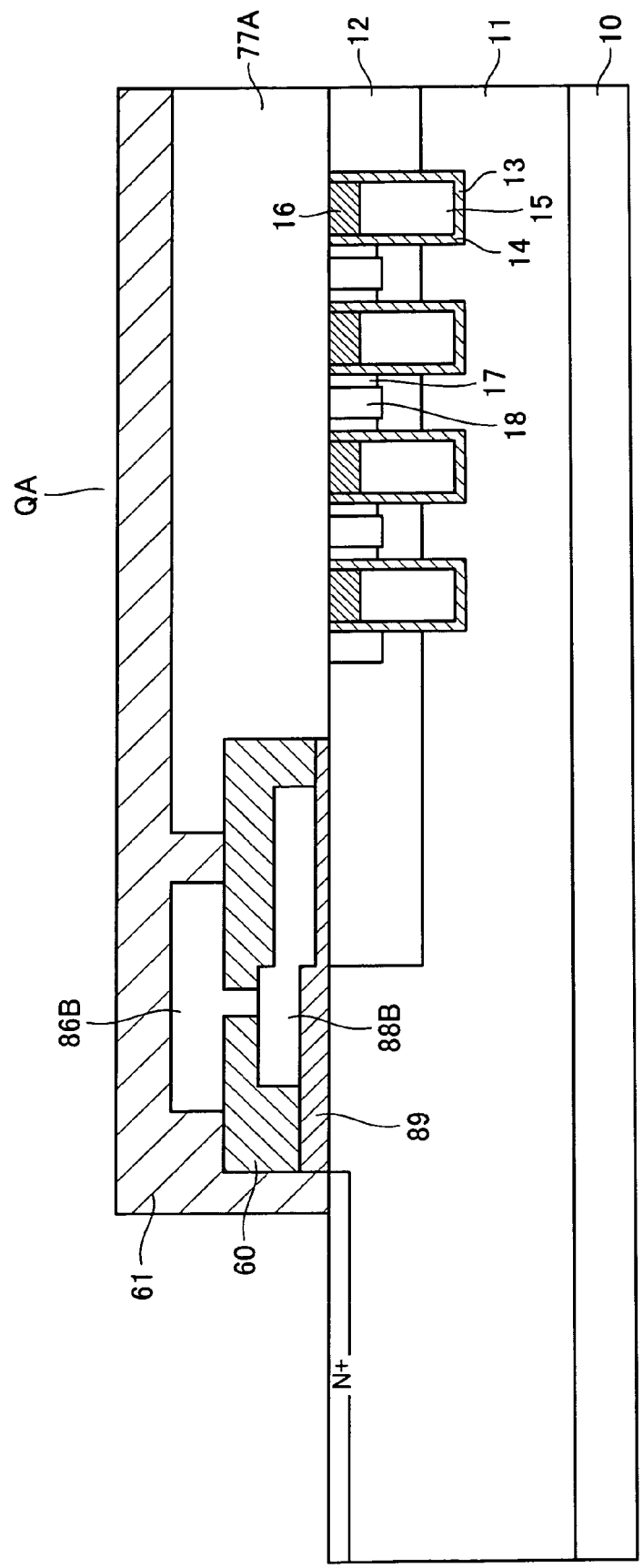
FIG. 5 shows a sectional view taken along line F–F' of FIG. 1.
Figure 6:
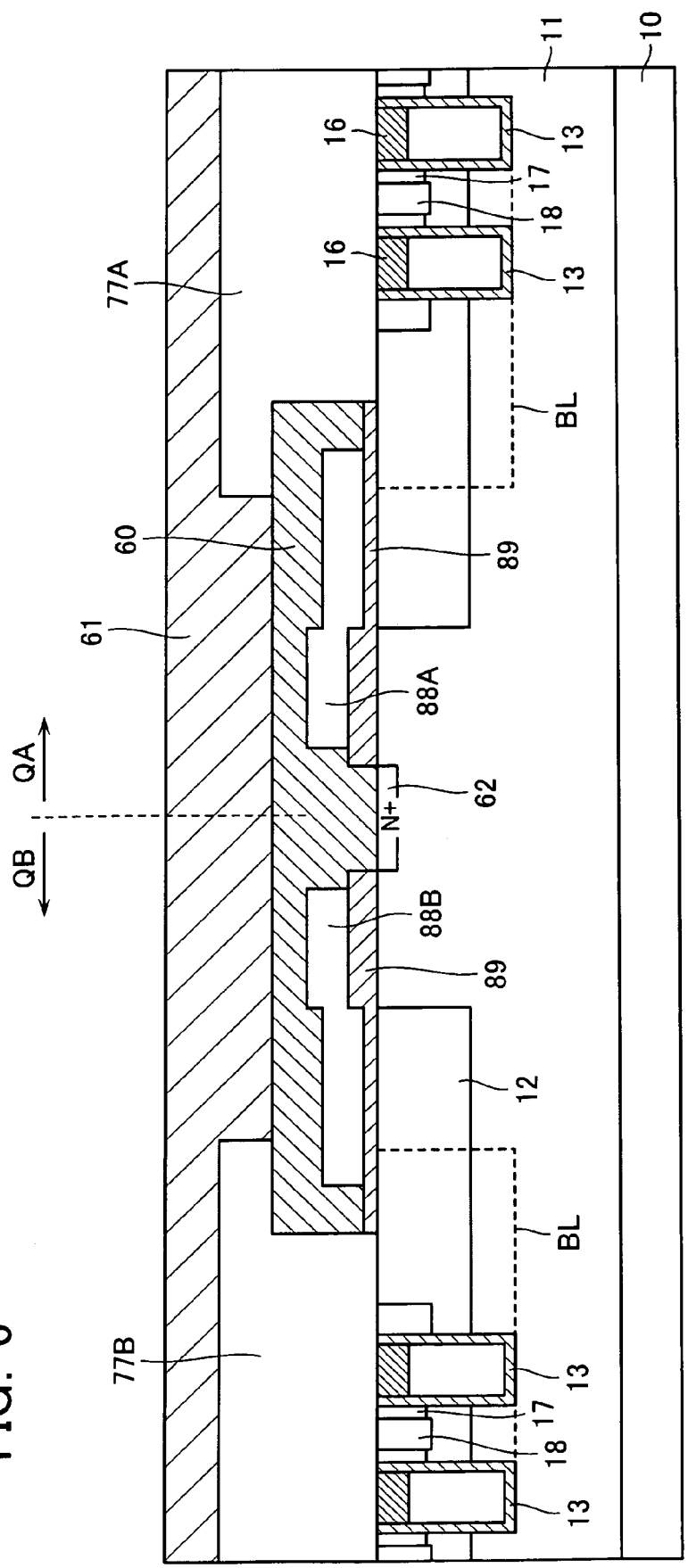
FIG. 6 is a sectional view taken along line G–G' of FIG. 1.

A first embodiment of this invention will next be explained in detail with reference to FIGS. 1 through 6 below. FIG. 1 is a plan view of a power MOS transistor module in accordance with the first embodiment. FIG. 2 shows a wiring diagram of a gate polysilicon wiring line pattern (88A, 88B) of this power MOS transistor module. FIG. 3 is a diagram for explanation of a region in which two transistors QA and QB are to be formed. Additionally, FIGS. 4, 5 and 6 are cross-sectional views taken along lines E–E', F–F' and G–G' of FIG. 1, respectively. Note here that the explanation below is given while adding, in these drawings, the same reference characters to the same parts or components as those in the first and second conventional art structures stated in the introductory part of the description.

As shown in FIGS. 4 and 5, transistors QA and QB of this embodiment also may be N-channel trench-gate type MOS transistors each having a trench gate 13 and $N^+$-type source diffusion layer 17 and others in a similar way to that of the first and second conventional art devices stated supra. These transistors may be fabricated by a similar manufacturing process to that stated supra. Note here that this is a mere example, and it is also possible to replace the transistors QA and QB with P-channel trench gate MOS transistors, by way of example. Other available examples include a device with the transistors QA and QB being replaced by insulated gate bipolar transistors (IGBTs) or by N-channel/P-channel planar gate MOS transistors.

As shown in FIG. 6, the transistors QA and QB commonly have or "share" a semiconductor substrate 11 and an $N^-$-type epitaxial layer 12. In addition, this embodiment does not have the metal substrate 50 used in the first conventional art and is arranged so that a common drain region of transistors QA and QB is formed by the semiconductor substrate 11. In these points, the power MOS transistor module of this embodiment is similar to the power MOS transistor module of the second conventional art.

A principal feature of the power MOS transistor module of this embodiment is as follows. As shown in FIG. 1, those components that constitute the transistor QA, such as a trench gate 13 and an $N^+$-type source diffusion layer 17 and the like, are formed so that these are subdivided into a plurality of first isolated island regions 71 and 71'. On the other hand, parts making up the transistor QB, such as trench gate 13 and $N^+$-type source diffusion layer 17 and others, are formed so that they are divided into a plurality of second isolated island regions 72 and 72'.

In FIG. 1, the plurality of isolated island regions 71 are designed so that each has a rectangular shape with its elongate direction being identical to the Y axis direction. These island regions 71 are laid out on the semiconductor substrate 10 in such a manner that each is isolated from the others while letting a long side become a neighboring side with respect to one of the second isolated island regions 72. The plurality of second isolated island regions 72 are designed so that each has a rectangular shape with its elongate side identical to the Y axis direction. These island regions 72 are laid out among the plurality of first isolated island regions 71 in such a manner that each is isolated from the others and that a long side becomes a neighboring side with respect to one of the first isolated island regions 71. To make a long story short, the first isolated island regions 71 and the second isolated island regions 72 are alternately arranged to have a stripe-shaped layout pattern on the semiconductor substrate 11. The transistors QA and QB share a drain region at a surface portion of semiconductor substrate 10 which underlies a boundary or "adjacency" line of the both regions.

As shown in FIG. 1, the first isolated island region 71' and second isolated island region 72' are designed to have a letter "L"-like shape with a combination of a plurality of shape-different rectangles. The reason of this will be described later.

Also note that as shown in FIG. 1, a source electrode 77A (first electrode layer) for supplying a current to $N^+$-type source diffusion layer 17 is formed per first isolated island region 71. Similarly a source electrode 77B (second electrode layer) is formed per second isolated island region 72.

To this source electrode 77A, a plate-shaped wiring electrode 80A (first electrode wiring line)—this is for connection to a first terminal S1 of the power MOS transistor module—is connected by a solder bump 81, for example. Similarly a plate-like wiring electrode 80B (second electrode wiring line), which is coupled to a second terminal S2 of the power MOS transistor module, is connected to the source electrode 77B by a solder bump 81, for example. These plate-like wiring electrodes 80A and 80B are formed so that their elongate direction is identical to a direction crossing over the adjacency line of the source electrodes 77A and 77B—that is, the layout direction of source electrodes 77A and 77B. Wiring electrode 80A is connected only to source electrode 77A; wiring electrode 80B is coupled only to source electrode 77B. The solder bumps 81 may be replaced with gold (Au) bumps. Alternatively, either aluminum bonding wires or Au bond wires may be used for connection between the source electrode 77A (77B) and wiring electrode 80A (80B).

The transistor QA also has a gate electrode 86A for applying a voltage to trench gate 13. The transistor QB has a gate electrode 86B for applying a voltage to trench gate 13.

Figure 10:
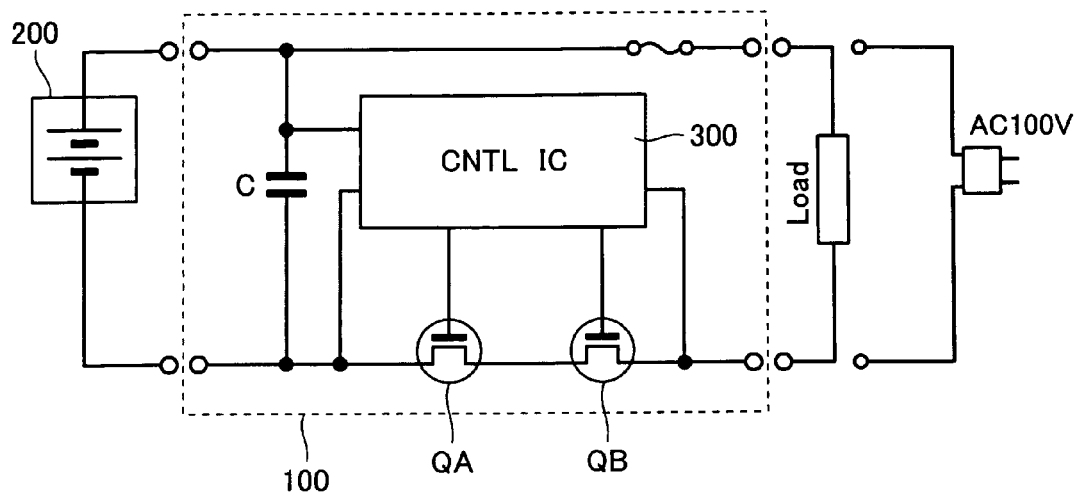
FIG. 10 schematically shows a configuration of a protection circuit 100 for use with a secondary battery unit.
Figure 11:
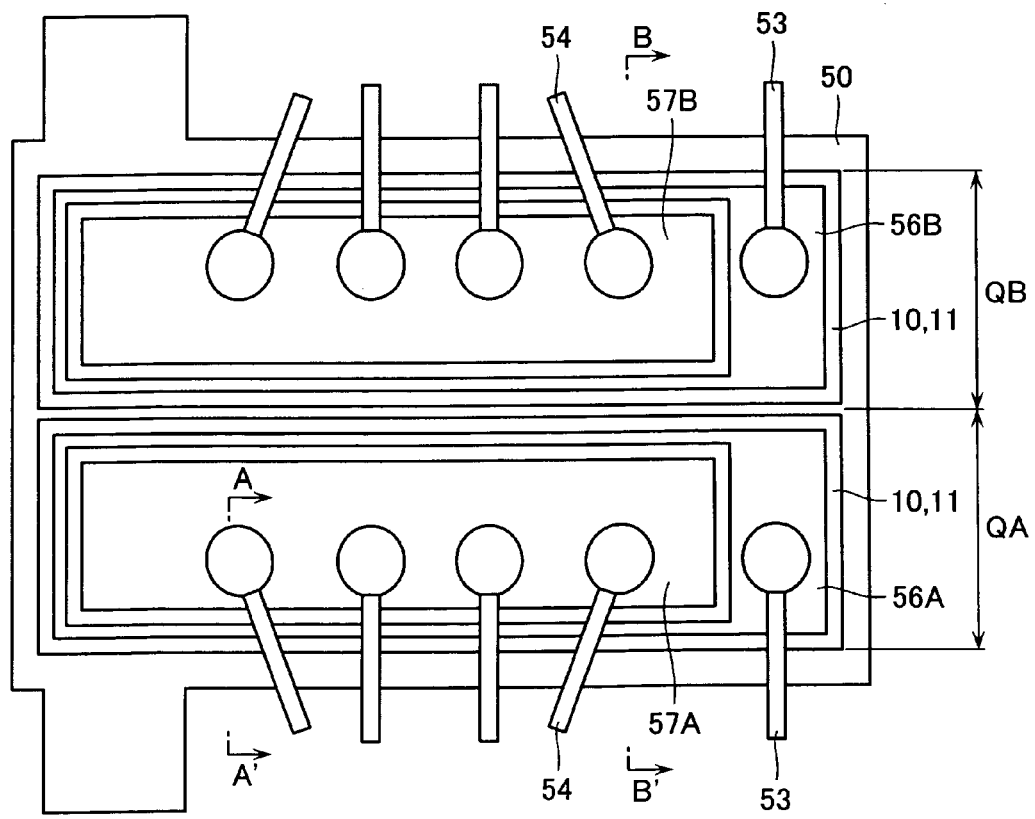
FIG. 11 shows a plan view of a power MOS transistor module in accordance with the first conventional art.
Figure 12:
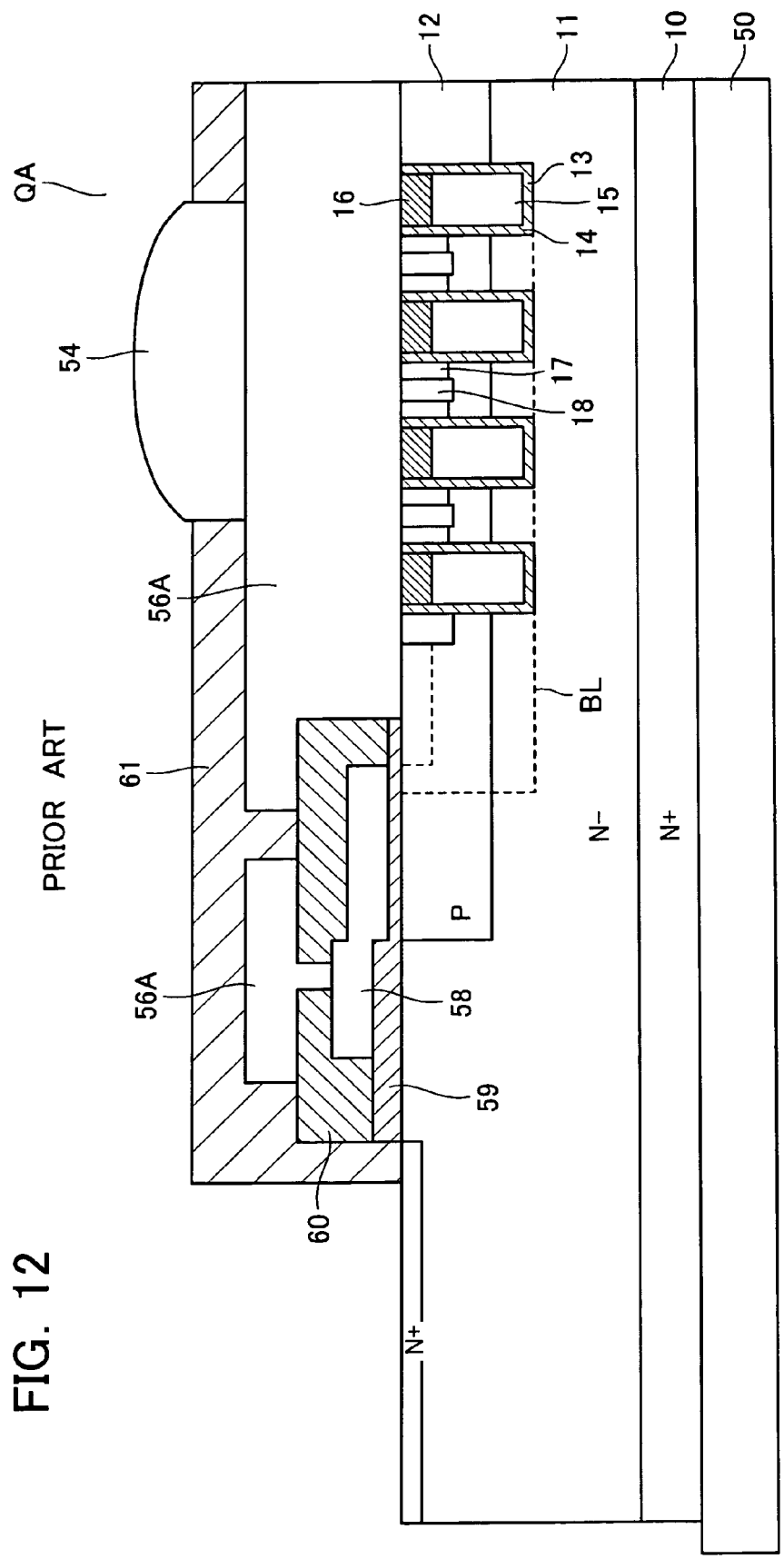
FIG. 12 shows a cross-sectional view as taken along line A–A' of FIG. 11.
Figure 13:
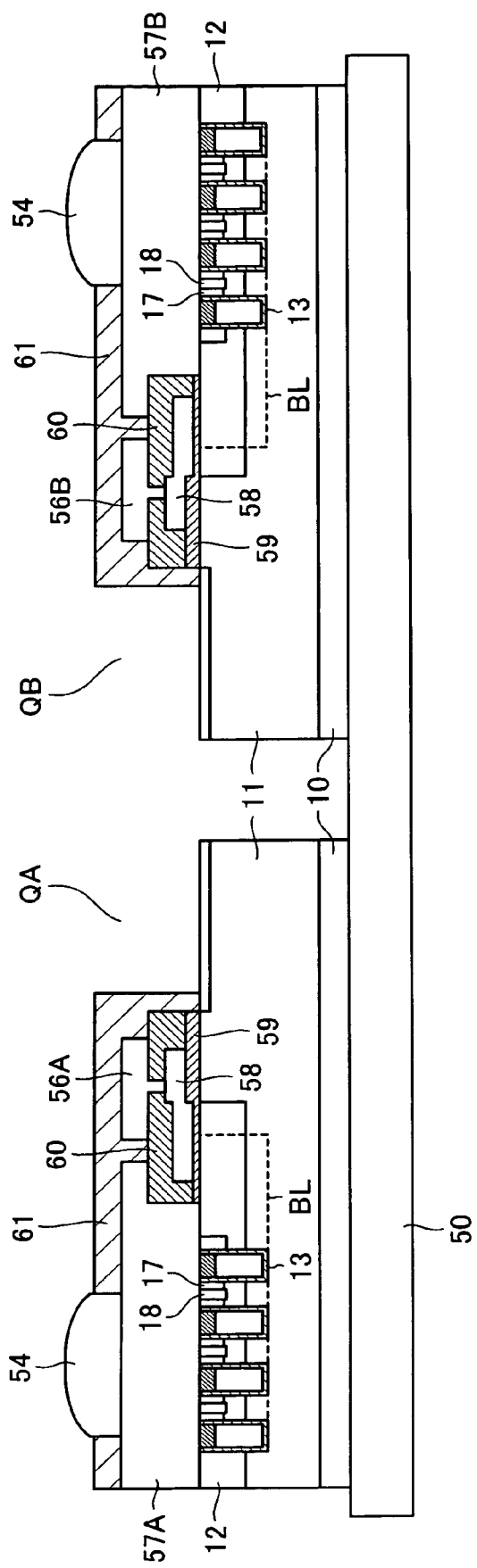
FIG. 13 is a sectional view taken along line B–B' of FIG. 11.
Figure 14:
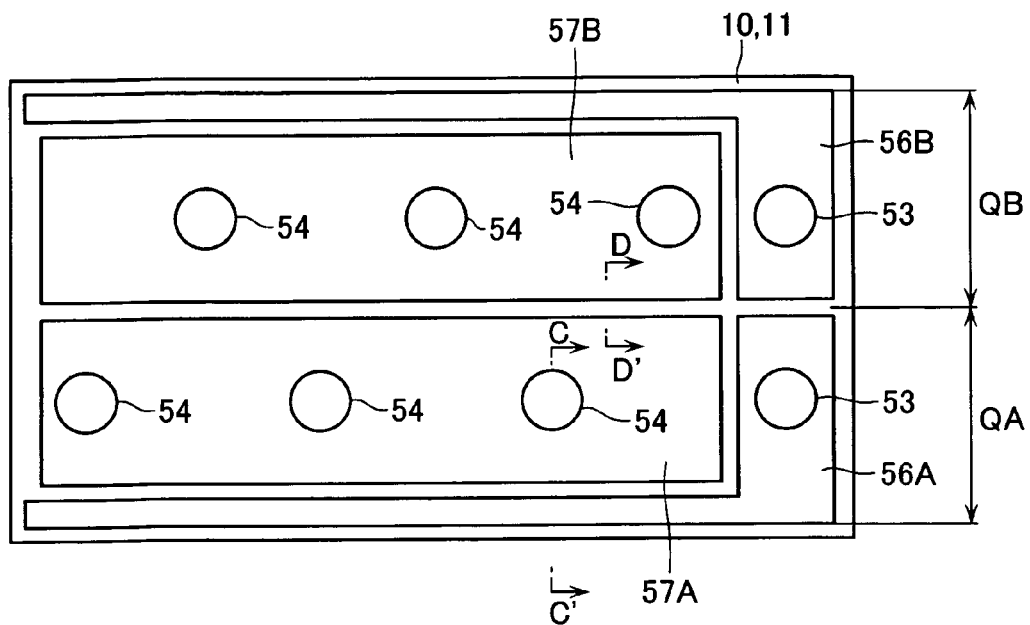
FIG. 14 shows a plan view of a power MOS transistor module in accordance with the second conventional art.
Figure 15:
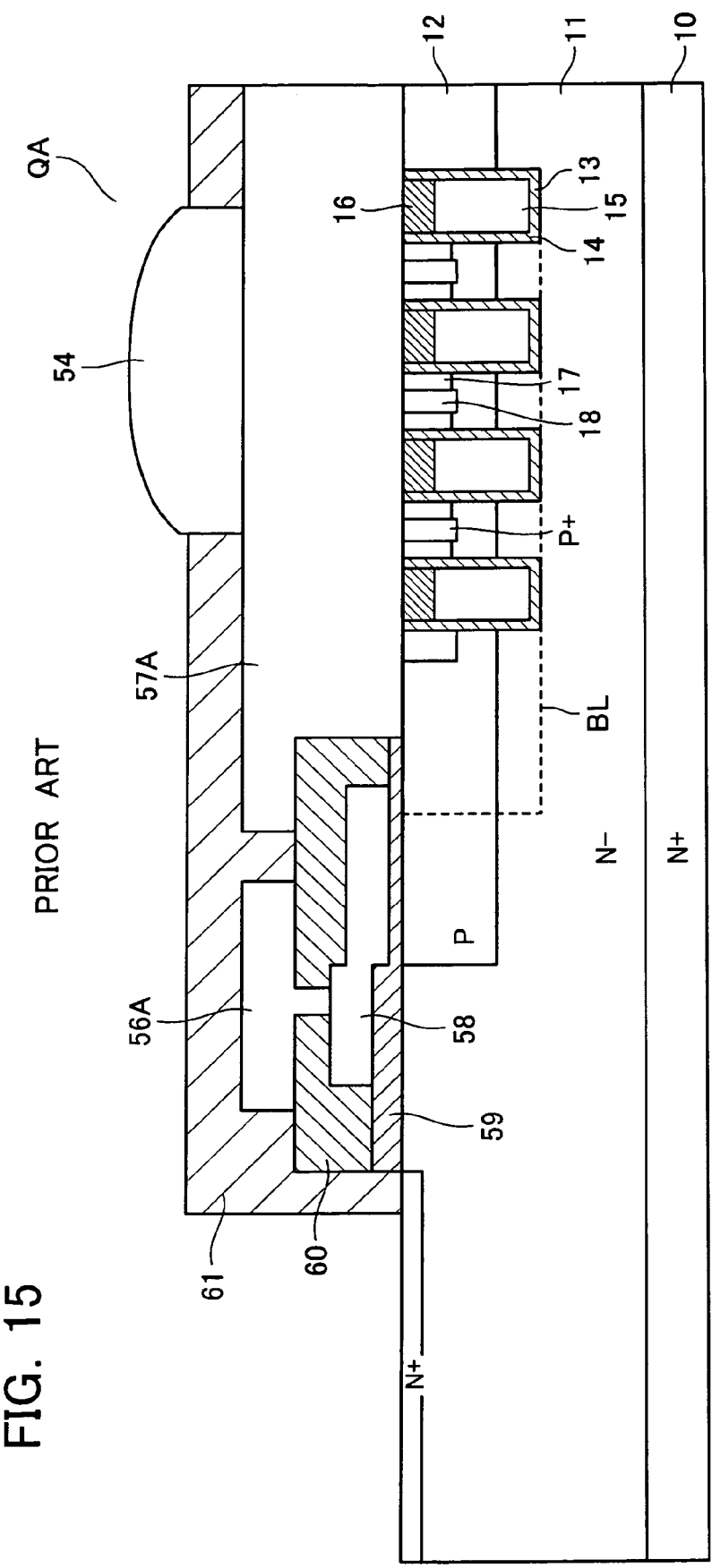
FIG. 15 shows a cross-sectional view as taken along line C–C' of FIG. 14.
Figure 16:
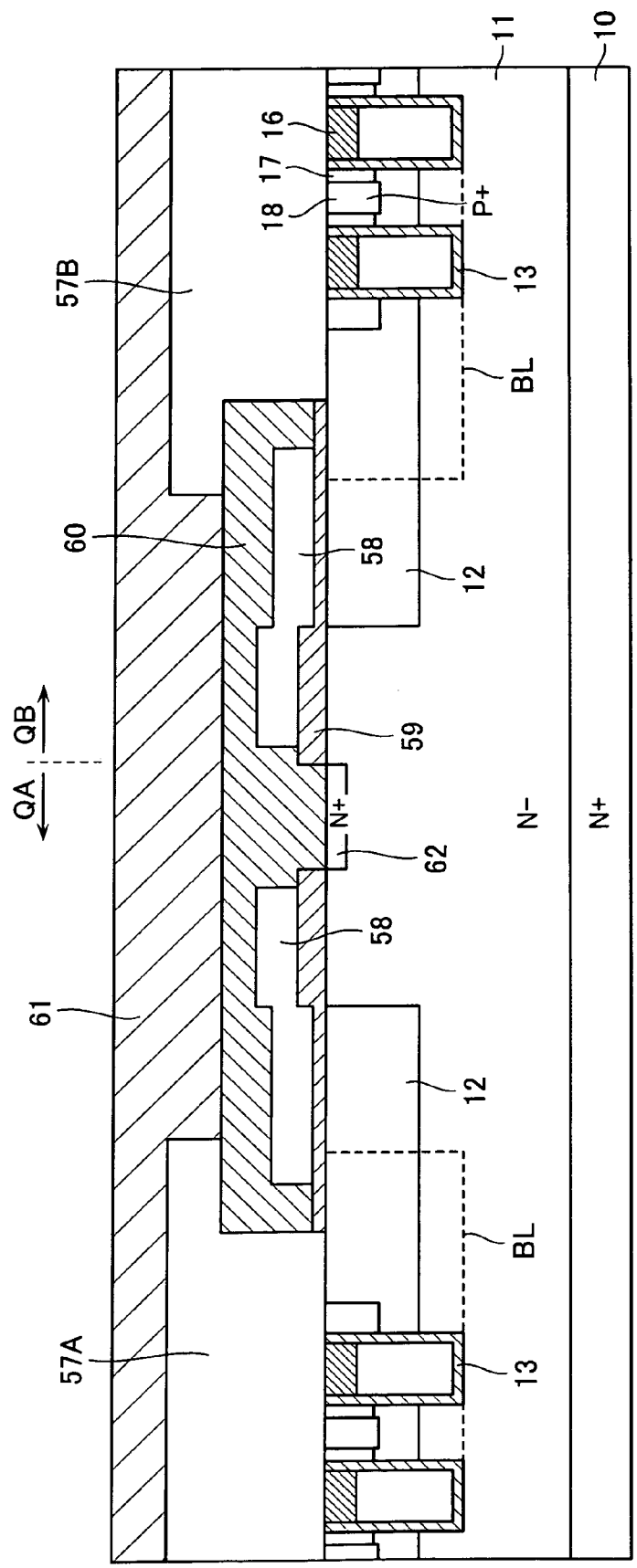
FIG. 16 is a sectional view taken along line D–D' of FIG. 14.

The gate electrode 86A has a solder bump 83 for connection to an external circuit (e.g., the controller IC 300 shown in FIG. 10 or the like) and a plate-like wiring electrode 87A (first external gate wiring line) for connection between the solder bump 83 and the external circuit.

Similarly the gate electrode 86B has a solder bump 84 for connection to the external circuit and a plate-like wiring electrode 87B (second external gate wiring line) for connection between the solder bump 84 and the external circuit. The wiring electrode 87A and wiring electrode 87B are drawn out in the opposite direction of that of wiring electrodes 80A and 80B, with the X-axis direction being as their elongate direction. Additionally, a region 86C (first connection region) in which the wiring electrode 87A and solder bump 83 are formed and a region 86D (second connection region) for fabrication of the wiring electrode 87B and solder bump 84 are formed with a Y-axis direction as the elongate direction thereof. These regions oppose each other at their side edges extending in an X-axis direction.

These gate electrodes 86A and 86B are connected to trench gates 13 via gate polysilicon wiring lines 88A and 88B shown in FIG. 2 and lead wires BL (see FIG. 5), respectively. As shown in FIGS. 4–6, gate polysilicon wiring lines 88A and 88B are formed above an $N^-$-type epitaxial layer 11 with a silicon oxide film 89 sandwiched therebetween.

Although a lead wire BL is formed between the gate polysilicon wiring line 88A and trench gate 13 of transistor QA, no such lead wire BL is formed between gate polysilicon wiring line 88A and trench gate 13 of transistor QB. Similarly, while a lead wire BL is formed between gate polysilicon wiring line 88B and trench gate 13 of transistor QB, no lead wire BL is formed between gate polysilicon wiring line 88B and trench gate 13 of transistor QA (see an F–F' cross-sectional view shown in FIG. 5). In this way, only the trench gate 13 of transistor QA is connected to the gate electrode 86A; only the trench gate 13 of transistor QB is coupled to gate electrode 86B. With such an arrangement, it is possible for the transistors QA and QB to operate in a way independent of each other.

As shown in FIG. 3, the first isolated island region 71' has a unique shape with an integral combination or "integration" of three first isolated island regions 71A, 71B and 71C having different rectangular shapes, rather than forming these three regions independently of one another. Similarly the second isolated island region 72' is not formed by two independent second isolated island regions 72A and 72B but formed to have a shape with an integral combination of them. Such shapes are employed because gate electrodes 86A and 86B are laid out in close proximity to these regions. Regions 71B and 72A are disposed in the Y axis direction, while letting their side edges extending together in the X axis direction be as their neighboring sides. In addition, regions 71C and 72B are arranged in the Y axis direction while being interposed between regions 86C and 86D. Region 71C is laid out with its side that extends in the X axis direction together with region 86C being as a neighboring side. Region 71D is placed with its side that extends in the X axis direction together with region 86D being as a neighboring side.

Here, as shown in FIG. 3, consider the case where the first isolated island regions 71A, 71B and 71C and second isolated island regions 72A and 72B are formed in a narrow region adjacent to the gate electrodes 86A and 86B in a way independent of each other. Unlike standard or "regular" isolated island regions 71 and 72, the first isolated island region 71B and second isolated island region 72A are laid out with their X-axis directional sides as the neighboring sides. Similarly, the first isolated island region 71C and second isolated island region 72B also are disposed with their X-axis directional sides as the neighboring sides.

As a result of such difference in direction of the neighboring sides in this way, the first isolated island regions 71A, 71B and 71C become adjacent to one another with their along-the-Y-axis-direction sides being as the neighboring sides. Any one of these regions 71A, 71B and 71C is the region that is used for fabrication of the transistor QA. Accordingly, it is possible to enlarge the area of the transistor QA by the scheme for combining or "uniting" together the three regions 71A, 71B and 71C into a single unified region 71' and then integrally forming therein a transistor QA as shown in FIG. 3, rather than by the scheme for forming such regions 71A–71C independently of one another. In the same view point, the scheme for combining together the second isolated island regions 72A and 72B into a single united region 72' and then integrally forming therein a transistor QB is more excellent in the ability to increase the area of transistor QB. For these reasons, the regions 71' and 72' of this embodiment are specifically designed to have the above-noted shapes.

Note that as shown in a G–G' cross-sectional view of FIG. 6, the gate polysilicon wiring lines 88A and 88B are electrically isolated from each other by an interlayer dielectric film 60 and passivation film 61 plus oxide film 89 and also are electrically insulated from the source electrodes 77A and 77B.

Trench gates 13 and $N^+$-type source diffusion layers 17 and others for making up the transistors QA and QB are formed in the regions surrounded by the gate polysilicon wiring lines 88A and 88B within respective isolated island regions 71 and 71'. As apparent from FIGS. 4–6, the trench gate 13 is formed within the first isolated island region to have a mesh-like planar shape. Note however that this invention is not limited thereto, and it is also possible to employ a device structure with a stripe-shaped trench gate 13 being formed in one direction only.

As stated above, in this embodiment, two transistors QA and QB are formed so that these are divided into a plurality of isolated island regions 71–71' and 72–72'. Owing to this, the both transistors QA and QB become greater in area of counter face therebetween than the first and second conventional art structures with each transistor formed in a single region. Accordingly, as shown in FIG. 6, the both transistors QA and QB share a drain region by means of the semiconductor substrate 11. Even when the silicon forming the semiconductor substrate 11 is high in electrical resistivity, the resulting area of the counter face becomes greater than that of the second conventional art. Thus it is possible to lower the turn-on (ON) resistance of the power MOS transistor module as a whole. In addition, with the feature that a source region is isolatively disposed in each region 71, 71', 72, 72', it is possible to readily detect the presence of any defective source region even when the electrode 81 goes away.

Figure 7:
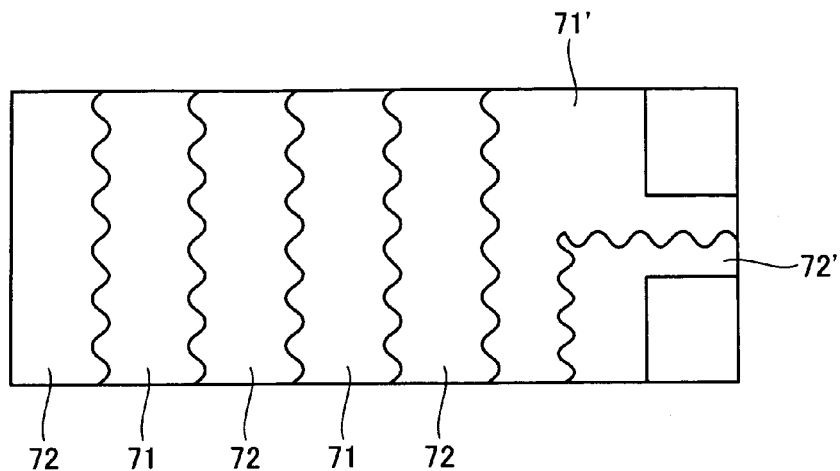
FIG. 7 shows a modified example of the embodiment of the invention.
Figure 8:
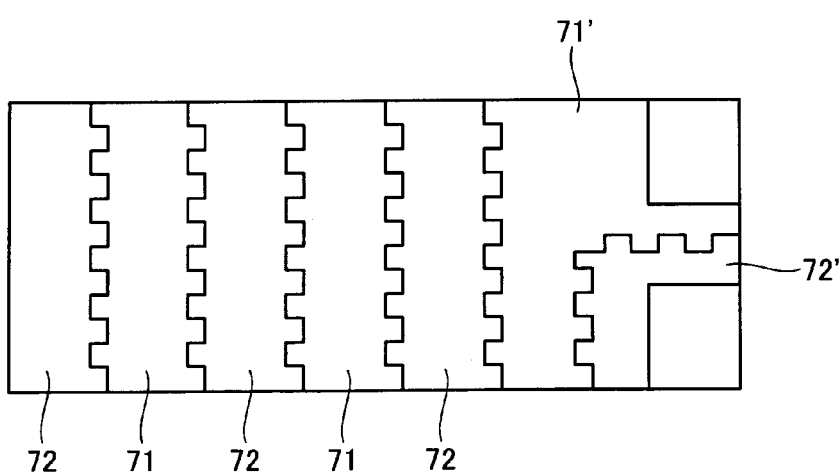
FIG. 8 shows another modification of the embodiment of the invention.
Figure 9:
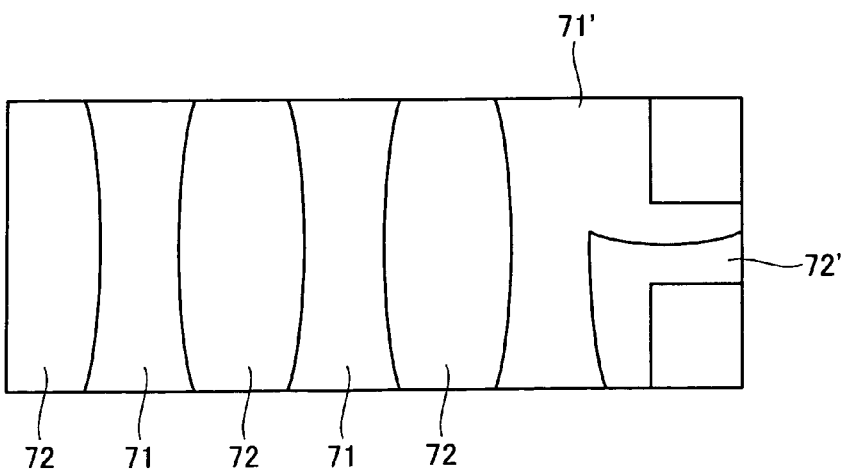
FIG. 9 shows still another modification of the embodiment of the invention.

Although the present invention has been disclosed and illustrated with respect to particular embodiments, this invention should not be limited thereto and various modifications, additions and replacements are available without departing from the scope of the invention. For example, the above-noted embodiment is arranged so that each of the first and second isolated island regions 71 and 72 has a rectangular shape with the boundary line therebetween being designed as a straight line. However, the invention is not limited only to this arrangement, and other schemes are available. An example is shown in FIG. 7, wherein the boundary line between first and second isolated island regions 71–72 is arranged to have a wavy line shape. With this arrangement, it is possible to further increase the area of the counter face of two transistors QA and QB. This makes it possible to further lower the ON resistance. Another example is that the boundary line is designed as a concave- and convex curve as shown in FIG. 8. Alternatively the boundary is designable as an arc-like curve as shown in FIG. 9. Using any one of these approaches makes it possible to enlarge the area of the counter face of both transistors QA and QB. Also note that the shape of an isolated island region also is not limited to the rectangle and may be designed into other shapes including, but not limited to, ellipses and polygons. It is also possible to form on the back surface of semiconductor substrate 10 a metallic film with its thickness as thin as possible to an extent that it hardly becomes a substrate, thereby making it possible to further lower the resistance value of the common drain region.

What is claimed is:

1. A semiconductor device comprising:
a semiconductor substrate; and
a first transistor and a second transistor formed on said semiconductor substrate, each of the first and second transistors having a first main electrode region formed on one surface side of said substrate, a second main electrode region formed on the other surface side of said substrate, and a gate electrode for control of a current flowable between said first main electrode region and said second main electrode region, while letting said second main electrode region be owned in common by said first and second transistors, wherein said first main electrode region of said first transistor is formed to be divided into a plurality of first isolated island regions on the one surface side of said semiconductor substrate, said first main electrode region of said second transistor is formed on the one surface side of said semiconductor substrate and is divided into a plurality of second isolated island regions as laid out adjacent to at least part of said plurality of first isolated island regions, at a portion whereat neighboring ones of said first isolated island regions face each other, the neighboring first isolated island regions are combined together into a unified first isolated island region, and in this unified first isolated island region said first main electrode region of said first transistor is integrally formed, at a portion whereat neighboring ones of said second isolated island regions face each other, the neighboring second isolated island regions are combined together into a unified second isolated island region, and in this united second isolated island region said second main electrode region is integrally formed, said first isolated island regions and said second isolated island regions are organized into at least first groups being alternately placed while letting a contour extending in a first direction be an adjacent portion and second groups being alternately placed while letting a contour extending in a second direction other than said first direction be an adjacent portion, one of the first isolated island regions of said first groups and its neighboring one of the first isolated island regions of said second groups are combined together into said unified first isolated island region, and one of the second isolated island regions of said first groups and its neighboring one of the second isolated island regions of said second groups are combined together into said unified second isolated island region.

2. The semiconductor device according to claim 1, wherein said gate electrode of said first transistor has a first connection region for connection to an external wiring line, said gate electrode of said second transistor has a second connection region for connection to an external wiring line, and the second isolated island regions of said second groups have an array of portions as laid out in said first direction together with said first connection region and said second connection region.

3. The semiconductor device according to claim 2, wherein the second isolated island region of said second groups is placed between said first connection region and said second connection region.

4. The semiconductor device according to claim 1, wherein a boundary line between said first isolated island regions and said second isolated island regions is a straight line in shape.

5. The semiconductor device according to claim 1, wherein a boundary line between said first isolated island regions and said second isolated island regions has a shape like a curved line with an alternate layout of protuberances and depressions.

6. The semiconductor device according to claim 1, wherein a boundary line between said first isolated island regions and said second isolated island regions is a wavy line in shape.

7. A semiconductor device comprising:
a semiconductor substrate; and
a first transistor and a second transistor formed above said semiconductor substrate, each of the first and second transistors having a first main electrode region formed on one surface side of said substrate, a second main electrode region formed on the other surface side of said substrate, and a gate electrode formed on the one surface side of said substrate for controlling a current flowable between said first main electrode region and said second main electrode region, while letting said second main electrode region be owned in common by said first and second transistors, wherein said first main electrode region of said first transistor is formed to be divided into a plurality of first isolated island regions on the one surface side of said semiconductor substrate, said first isolated island regions being commonly connected together to a first electrode wiring line through a plurality of first electrode layers formed at respective upper surfaces of said first isolated island regions, said first main electrode region of said second transistor is formed on the one surface side of said semiconductor substrate and is divided into a plurality of second isolated island regions in close proximity to said plurality of first isolated island regions, said plurality of second isolated island regions being commonly connected together to a second electrode wiring line via a plurality of second electrode layers formed at respective upper surfaces of said second isolated island regions, said gate electrode of said first transistor has a first connection region as connected to a first external gate wiring line, said gate electrode of said second transistor has a second connection region being laid out in a first direction together with said first connection region and being connected to a second external gate wiring line, said plurality of first isolated island regions and said plurality of second isolated island regions are arrayed in a second direction crossing said first direction, said plurality of first isolated island regions including a specified first isolated island region neighboring upon said first connection region and having a first portion aligned in said first direction together with said first connection region, and said plurality of second isolated island regions including a specified second isolated island region neighboring upon said second connection region and having a second portion aligned in said first direction together with said second connection region.

8. The semiconductor device according to claim 7, wherein said specified first isolated island region has a third portion extending in the first direction together with a remaining portion of said specified second isolated island region other than said second portion thereof.

9. The semiconductor device according to claim 8, wherein said first portion and said second portion are placed between said first connection region and said second connection region.

10. The semiconductor device according to claim 8, wherein said first electrode wiring line and said second electrode wiring line are plate-like electrodes.

11. The semiconductor device according to claim 8, wherein said first electrode wiring line and said second electrode wiring line are plate-like electrodes with their elongate direction identical to a direction along which said plurality of first main electrodes and said plurality of second main electrodes are queued.

12. The semiconductor device according to claim 11, wherein said first external gate wiring line and said second external gate wiring line are plate-like electrodes.

13. The semiconductor device according to claim 11, wherein said first external gate wiring line and said second external gate wiring line are plate-like electrodes with their elongate direction identical to a direction along which said plurality of first main electrodes and said plurality of second main electrodes are lined up.

14. The semiconductor device according to claim 13, wherein said first external gate wiring line and said second external gate wiring line are extended in an opposite direction to said first electrode wiring line and said second electrode wiring line.

15. The semiconductor device according to claim 7, wherein a boundary line between said first isolated island regions and said second isolated island regions is a straight line in shape.

16. The semiconductor device according to claim 7, wherein a boundary line between said first isolated island regions and said second isolated island regions has a shape like a curved line with an alternate layout of protuberances and depressions.

17. The semiconductor device according to claim 7, wherein a boundary line between said first isolated island regions and said second isolated island regions is a wavy line in shape.

18. The semiconductor device according to claim 7, wherein said plurality of first electrode layers and said plurality of second electrode layers are alternately placed in the second direction.

19. The semiconductor device according to claim 7, wherein said first electrode layers are connected through bumps to said first electrode wiring line whereas said second electrode layers are connected via bumps to said second electrode wiring line.

20. The semiconductor device according to claim 7, wherein said first electrode layers are connected by bonding to said first electrode wiring line whereas said second electrode layers are connected by bonding to said second electrode wiring line.

* * * * *